(12) United States Patent
La Tulipe, Jr. et al.

(10) Patent No.: US 7,704,869 B2
(45) Date of Patent: Apr. 27, 2010

(54) METHOD OF FABRICATING ULTRA-DEEP VIAS AND THREE-DIMENSIONAL INTEGRATED CIRCUITS USING ULTRA-DEEP VIAS

(75) Inventors: Douglas C. La Tulipe, Jr., Guilderland, NY (US); Mark Todhunter Robson, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 138 days.

(21) Appl. No.: 11/853,139

(22) Filed: Sep. 11, 2007

(65) Prior Publication Data
US 2009/0068835 A1 Mar. 12, 2009

(51) Int. Cl.
*H01L 21/4763* (2006.01)
(52) U.S. Cl. ............... 438/618; 438/629; 438/634; 438/648; 257/E21.249; 257/E21.476
(58) Field of Classification Search .......... 257/E21.249, 257/E21.476; 438/618, 629, 634, 648
See application file for complete search history.

(56) References Cited

U.S. PATENT DOCUMENTS

| 5,841,195 | A | 11/1998 | Lin | |
|---|---|---|---|---|
| 6,133,144 | A * | 10/2000 | Tsai et al. | 438/634 |
| 6,180,997 | B1 * | 1/2001 | Lin | 257/637 |
| 6,232,663 | B1 | 5/2001 | Taniguchi et al. | |
| 6,727,169 | B1 * | 4/2004 | Raaijmakers et al. | 438/622 |
| 6,943,067 | B2 | 9/2005 | Greenlaw | |
| 7,205,224 | B2 * | 4/2007 | Mandal | 438/622 |
| 2002/0076916 | A1 | 6/2002 | Yamashita et al. | |
| 2002/0142235 | A1 | 10/2002 | Hamanaka et al. | |
| 2003/0129829 | A1 | 7/2003 | Greenlaw | |
| 2004/0130029 | A1 * | 7/2004 | Raaijmakers et al. | 257/758 |
| 2004/0232554 | A1 | 11/2004 | Hirano et al. | |
| 2004/0241984 | A1 | 12/2004 | Schwan et al. | |
| 2006/0240652 | A1 * | 10/2006 | Mandal | 438/562 |
| 2008/0303169 | A1 | 12/2008 | Goller et al. | |

OTHER PUBLICATIONS

Office Action (Mail Date Jun. 25, 2009) for U.S. Appl. No. 11/853,118, Filing Date Sep. 11, 2007; Confirmation No. 2505.

* cited by examiner

*Primary Examiner*—Bradley K Smith
*Assistant Examiner*—Marvin Payen
(74) *Attorney, Agent, or Firm*—Schmeiser, Olsen & Watts; Louis J. Percello

(57) ABSTRACT

A method of forming a high aspect ratio via opening through multiple dielectric layers, a high aspect ratio electrically conductive via, methods of forming three-dimension integrated circuits, and three-dimensional integrated circuits. The methods include forming a stack of at least four dielectric layers and etching the first and third dielectric layers with processes selective to the second and fourth dielectric layers, etching the second and third dielectric layers with processes selective to the first and second dielectric layers. Advantageously the process used to etch the third dielectric layer is not substantially selective to the first dielectric layer.

16 Claims, 14 Drawing Sheets

METHOD OF FABRICATING ULTRA-DEEP VIAS AND THREE-DIMENSIONAL INTEGRATED CIRCUITS USING ULTRA-DEEP VIAS

This invention was made with Government support under contract number N66001-04-C-8032 awarded by the Defense Advanced Research Projects Agency (DARPA). The government has certain rights in this invention.

RELATED APPLICATIONS

This Application is related to application Ser. No. 11/853,118 filed on Sep. 11, 2007.

FIELD OF THE INVENTION

The present invention relates to the field of integrated circuits; more specifically, it relates to structures of and methods for fabricating ultra-deep vias in integrated circuits and structures of and methods for fabricating three-dimensional integrated circuits.

BACKGROUND OF THE INVENTION

In order to reduce the footprint and improve the speed of integrated circuits various three-dimensional integrated circuit structures have been proposed. Traditional integrated circuit structures have been two dimensional, in that all the active devices have been formed in a same plane in a same semiconductor layer. Three-dimensional integrated circuits utilize vertically stacked semiconductor layers with active devices formed in each of the stacked semiconductor layers.

The fabrication of three-dimensional integrated circuits poses many challenges particularly in the methodology for interconnecting devices in the different semiconductor layers together. The total depth of these interconnects can exceed 1.5 um with diameters in the sub 0.2 um range. It is difficult to fill vias having such large depth to width aspect ratios with high quality, defect free metal. In particular, the metal fill of large aspect ratio and very deep vias often contain voids which can increase the resistance of the via and result in yield loss as well as reduce the reliability of the device. Accordingly, there exists a need in the art to overcome the deficiencies and limitations described hereinabove.

SUMMARY OF THE INVENTION

A first aspect of the present invention is a method, comprising: forming an etch stop layer on a top surface of a substrate; forming a first dielectric layer on a top surface of the etch stop layer; forming a profile modulation layer on a top surface of the first dielectric layer; forming a second dielectric layer on a top surface of the profile modulation layer; forming a photo-imaging layer on a top surface of the second dielectric layer; forming an opening in the photo-imaging layer, a region of the top surface of the second dielectric layer exposed in a bottom of the opening; reactive ion etching the second dielectric layer with a first etch chemistry selective to the profile modulation layer to form an opening through the second dielectric layer; reactive ion etching the profile modulation layer with a second etch chemistry selective to the first and second dielectric layers to extend the opening through the profile modulation layer; reactive ion etching the first dielectric layer with a third etch chemistry selective to the profile modulation layer and selective to the etch stop layer to extend the opening through the first dielectric layer; reactive ion etching the etch stop layer with a fourth etch chemistry selective to the first and second dielectric layers to extend the opening through the etch stop layer; and removing the photo-imaging layer, after the removing the photo-imaging layer, the opening extending from the top surface of the second dielectric layer, through the second dielectric layer, through the profile modulation layer, through the first dielectric layer and through the etch stop layer to the top surface of the substrate.

A second aspect of the present invention is the first aspect, wherein the third etch chemistry is not selective to the second dielectric layer.

A third aspect of the present invention is the first aspect, wherein the first and third etch chemistries are a same chemistry.

A fourth aspect of the present invention is the first aspect, wherein the second and fourth etch chemistries are a same chemistry.

A fifth aspect of the present invention is the first aspect, wherein the removing the photo-imaging layer is performed between the reactive ion etching the first dielectric layer and the reactive ion etching the etch stop layer.

A sixth aspect of the present invention is the first aspect, wherein the first dielectric layer and second dielectric layer comprise silicon oxide and the profile modulation layer and the etch stop layer comprise silicon nitride.

A seventh aspect of the present invention is the first aspect, wherein: a first width of the opening measured in first direction parallel to the top surface of the second dielectric layer at the top surface of the second dielectric layer is greater than a second width of the opening measured in the first direction at the top surface of the profile modulation layer and greater than a third width of the opening measured in the first direction at the top surface of the substrate, the second width greater than or equal to the third width; and wherein a ratio of a depth of the opening measured in a second direction perpendicular to the first direction from the top surface of the second dielectric layer to the top surface of the substrate to the first width is equal to or greater than five.

An eighth second aspect of the present invention is the first aspect, further including: after the removing the photo-imaging layer, filling the opening with the electrical conductor.

A ninth aspect of the present invention is the eighth aspect, wherein the filling the opening with an electrical conductor comprises: depositing a tantalum nitride layer over sidewalls and a bottom of the opening; depositing a tantalum layer on the tantalum nitride layer; depositing a seed copper layer the tantalum layer; electroplating an electroplated copper layer on the seed copper layer, the electroplated copper layer completely filling remaining spaces in the opening; and performing a chemical-mechanical-polish to remove the tantalum nitride layer, the tantalum layer, the seed copper layer and the electroplated copper layer from over the top surface of the second dielectric layer.

A tenth aspect of the present invention is the first aspect, wherein the photo-imaging layer includes a photoresist layer over an antireflective coating on the top surface of the first dielectric layer and the forming the opening in the photo-imaging layer comprises exposing the photoresist layer to actinic radiation through a patterned photomask, developing the exposed photoresist layer and reactive ion etching the antireflective coating with an initial etch chemistry where the anti-reflective coating is not protected by the photoresist layer.

An eleventh second aspect of the present invention is the tenth aspect, wherein the initial etch chemistry is selective to the photoresist layer and the first dielectric layer and wherein the initial, second and fourth etch chemistries are a same chemistry.

A twelfth aspect of the present invention is a structure comprising: forming a first substrate, the first substrate including: first transistors electrically connected to a set of wiring levels, each wiring level including electrically conductive wires in a respective dielectric layer; an etch stop layer on a top surface of an uppermost wiring level of the set of wiring levels that is furthest from the substrate, the etch stop layer in contact with a wire of the uppermost wiring level; and a first dielectric bonding layer on a top surface of the etch stop layer; forming a second substrate, the second substrate including: a second dielectric bonding layer; a buried oxide layer on a top surface of the second dielectric bonding layer; a semiconductor layer on a top surface of the buried oxide layer, the semiconductor layer including second transistors electrically isolated from each other by dielectric isolation in the silicon layer; a profile modulation layer on a top of the silicon layer and on a top surface of the dielectric isolation; and a first dielectric layer on a top surface of the profile modulation layer; bonding a top surface of the first dielectric bonding layer to a bottom surface of the second dielectric bonding layer, the first and second dielectric bonding layers, the buried oxide layer and the dielectric isolation comprising a multilayer second dielectric layer; forming a photo-imaging layer on a top surface of the first dielectric layer; forming an opening in the photo-imaging layer, a region of the top surface of the first dielectric layer exposed in a bottom of the opening; reactive ion etching the first dielectric layer with a first etch chemistry selective to the profile modulation layer to form an opening through the first dielectric layer; reactive ion etching the profile modulation layer with a second etch chemistry selective to the first and second dielectric layers to extend the opening through the profile modulation layer; reactive ion etching the second dielectric layer with a third etch chemistry selective to the profile modulation layer and selective to the etch stop layer to extend the opening through the second dielectric layer; reactive ion etching the etch stop layer with a fourth etch chemistry selective to the first and second dielectric layers and to the wire to extend the opening through the etch stop layer; removing the photo-imaging layer, after the removing the photo-imaging layer the opening extending from the top surface of the first dielectric layer, through the profile modulation layer, through the second dielectric layer, through the second dielectric layer and through the etch stop layer to a top surface of the wire; and filling the opening with an electrical conductor, the electrical conductor in electrical contact with the wire.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
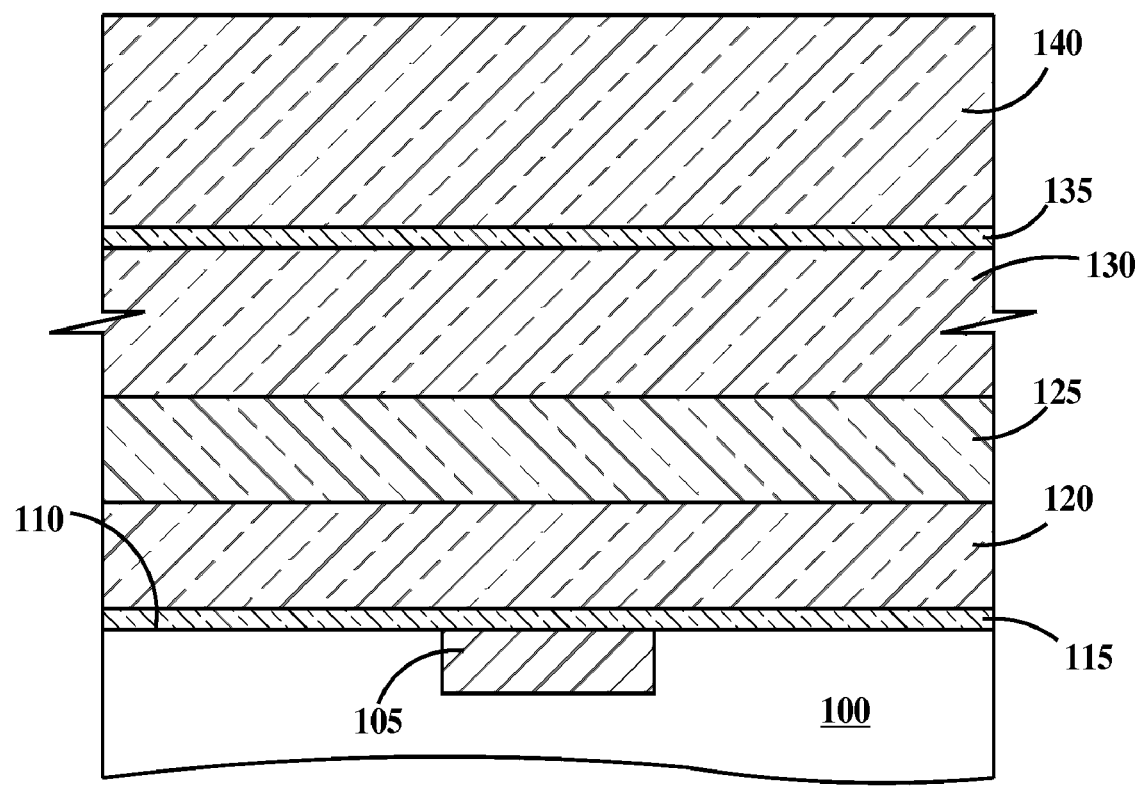
FIGS. 1A through 1J are cross-sections of the fabrication of an exemplary electrically conductive via according to embodiments of the present invention.

FIGS. 1A through 1J are cross-sections of the fabrication of an exemplary electrically conductive via according to embodiments of the present invention. In FIG. 1A, formed in a semiconductor substrate 100 is a metal wire 105. Formed on a top surface 110 of substrate 100 is a dielectric etch stop layer 115. Formed on top of etch stop layer 115 is a first dielectric layer 120. Formed on first dielectric layer 120 is a second dielectric layer 125. Formed on second dielectric layer 125 is a third dielectric layer 130. Formed on top of third dielectric layer 130 is a profile modulation layer 135. Formed on profile modulation layer 135 is a fourth dielectric layer 140. Semiconductor substrate 100 may comprise, for example, Si, SiGe, Ge, GaAs or InP.

The stack of dielectric materials consisting of dielectric etch stop layer 115, first dielectric layer 120, second dielectric layer 125, third dielectric layer 130, profile modulation layer 135 and fourth dielectric layer 140 simulates a structure that conductive vias are formed through in fabrication of a three-dimensional integrated circuit according to embodiments of the present invention described infra. Therefore in one example, etch stop layer 115 and first dielectric layer 120 represent layers on a lower semiconductor substrate and second dielectric layer 125, third dielectric layer 130, profile modulation layer 135 and fourth dielectric layer 140 represent layers on an upper semiconductor layers with first and second dielectric layers 120 and 125 representing oxide bonding layers that bond the two substrates together. Third dielectric layer 130 represents a dielectric trench isolation (TI) or dielectric shallow trench isolation (STI) on a buried oxide layer (BOX) of a silicon-on-insulator (SOI) substrate.

In accordance with the simulation of a three-dimensional integrated circuit according to embodiments of the present invention, etch stop layer 115 is silicon nitride and in one example is about 500 Å thick, first dielectric layer 120 is low temperature silicon oxide (LTO) and in one example is between about 2500 Å and about 3500 Å thick, second dielectric layer 125 is LTO and in one example is between about 2500 Å and about 3500 Å thick, third dielectric layer 130 is high density plasma silicon (HDP) oxide thermal oxide and in one example is about 3600 Å thick, profile modulation layer 135 is silicon nitride and in one example is about 500 Å thick and fourth dielectric layer 140 is HDP oxide and in one example is about 4700 Å thick. In one example, metal wire 105 comprises copper. The HDP oxide of third dielectric layer 130 and fourth dielectric layer 140 may be independently replaced with plasma enhanced chemical vapor deposition (PECVD) oxide, ultrahigh density plasma (UHP) oxide, tetraethoxysilane (TEOS) oxide or spin-on-oxide. The silicon nitride of etch stop layer 115 and profile modulation layer 135 may be independently replaced with silicon carbide, silicon oxy nitride, silicon oxy carbide or Nblock (SiCNH). In oxide fusion bonding applications, first and second dielectric layer are LTO, but in other application may be independently thermal oxide, HDP oxide, PECVD oxide, UDP oxide, TEOS oxide or spin-on-oxide. In one example, thicknesses of etch stop layer 115 and profile modulation layer 135 are independently about 5 times less than a thickness of either fourth dielectric layer 140 or a combined thickness of first, second and third dielectric layers 120, 125 and 130.

An LTO oxide is a silicon oxide that is formed at temperatures below about 350° C. In one example, LTO oxides are formed using $N_2O$ in a plasma enhanced chemical vapor deposition (PECVD) process. An HDP oxide are specifically prepared to be fusion bonded to each other.

First second, third and fourth dielectric layers 120, 125, 130 and 140 are advantageously first similar materials (e.g., silicon oxides) and etch stop layer 115 and profile modulation layer 135 are advantageously second similar materials (e.g. silicon nitrides), where the second materials may be selectively plasma etched relative to the first materials.

Figure 1B:
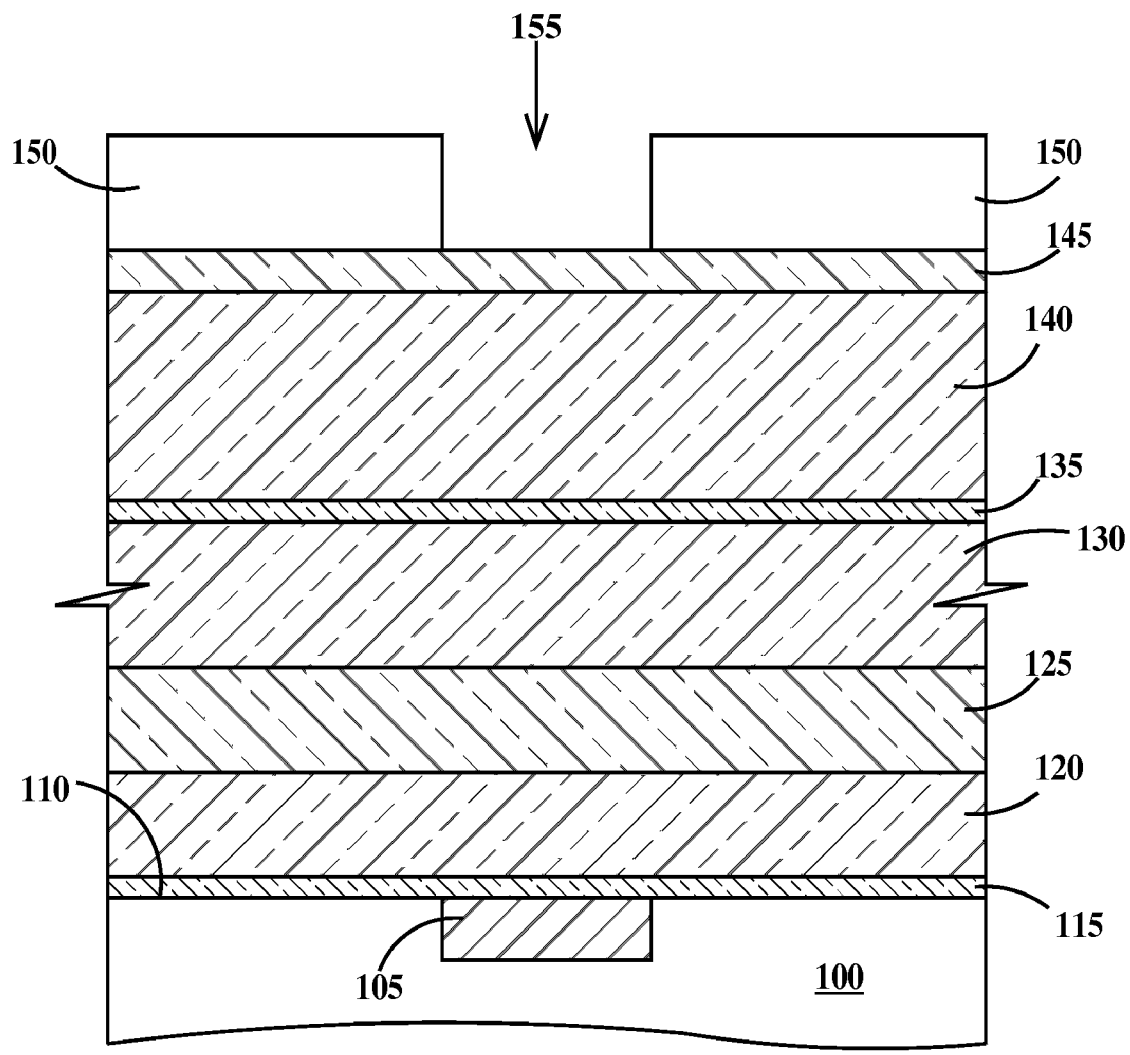

In FIG. 1B, an optional antireflective coating (ARC) 145 is formed on fourth dielectric layer and a photoresist layer 150 formed on top of the ARC. An opening 155 is formed in photoresist layer 150 photolithographically by exposing photoresist layer 150 to actinic radiation through a patterned photomask and then developing the photoresist layer to transfer the pattern of the photomask into the photoresist layer. A region of ARC 145 is exposed in the bottom of opening 155. ARC 145 is a bottom ARC or BARC since it is formed under photoresist layer 150. A top ARC (TARC) formed over the photoresist may be substituted or both a TARC and BARC may be used. The combination of a photoresist layer and an ARC (i.e., BARC, TARC or both BARC and TARC) is defined as a photo-imaging layer.

Figure 1C:
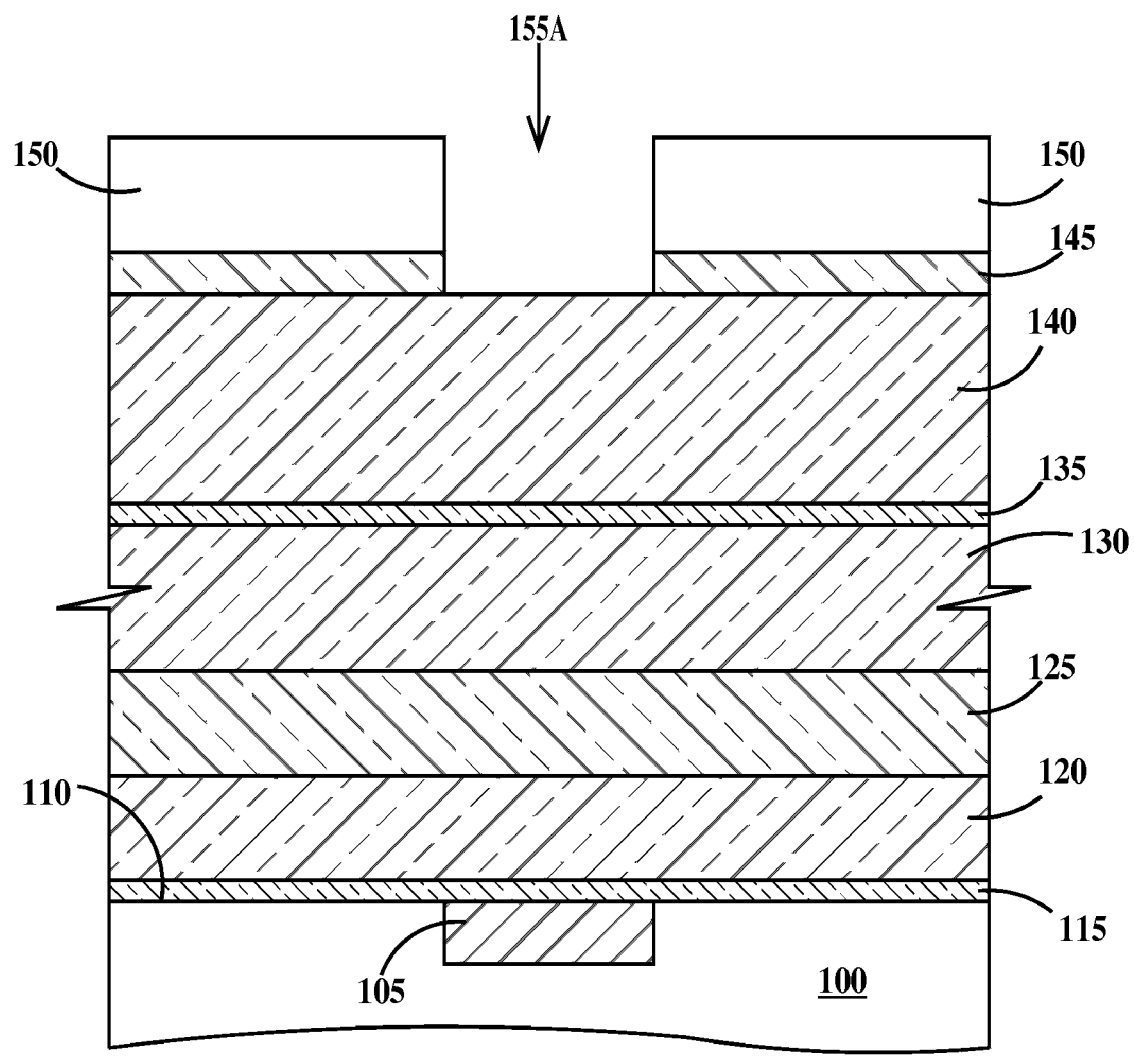

In FIG. 1C, the region of ARC 145 exposed in opening 155 of FIG. 1B is removed using a reactive ion etch (RIE) that etches ARC 145 faster than photoresist layer 150 (i.e., ARC 145 is RIE'd selective to photoresist layer 150) to expose a region of fourth dielectric layer 140 in the bottom of an opening 155A. An example RIE process for etching ARC 145 includes etching with a mixed $CF_4/CHF_3/Ar/O_2$ gas derived plasma.

Figure 1D:
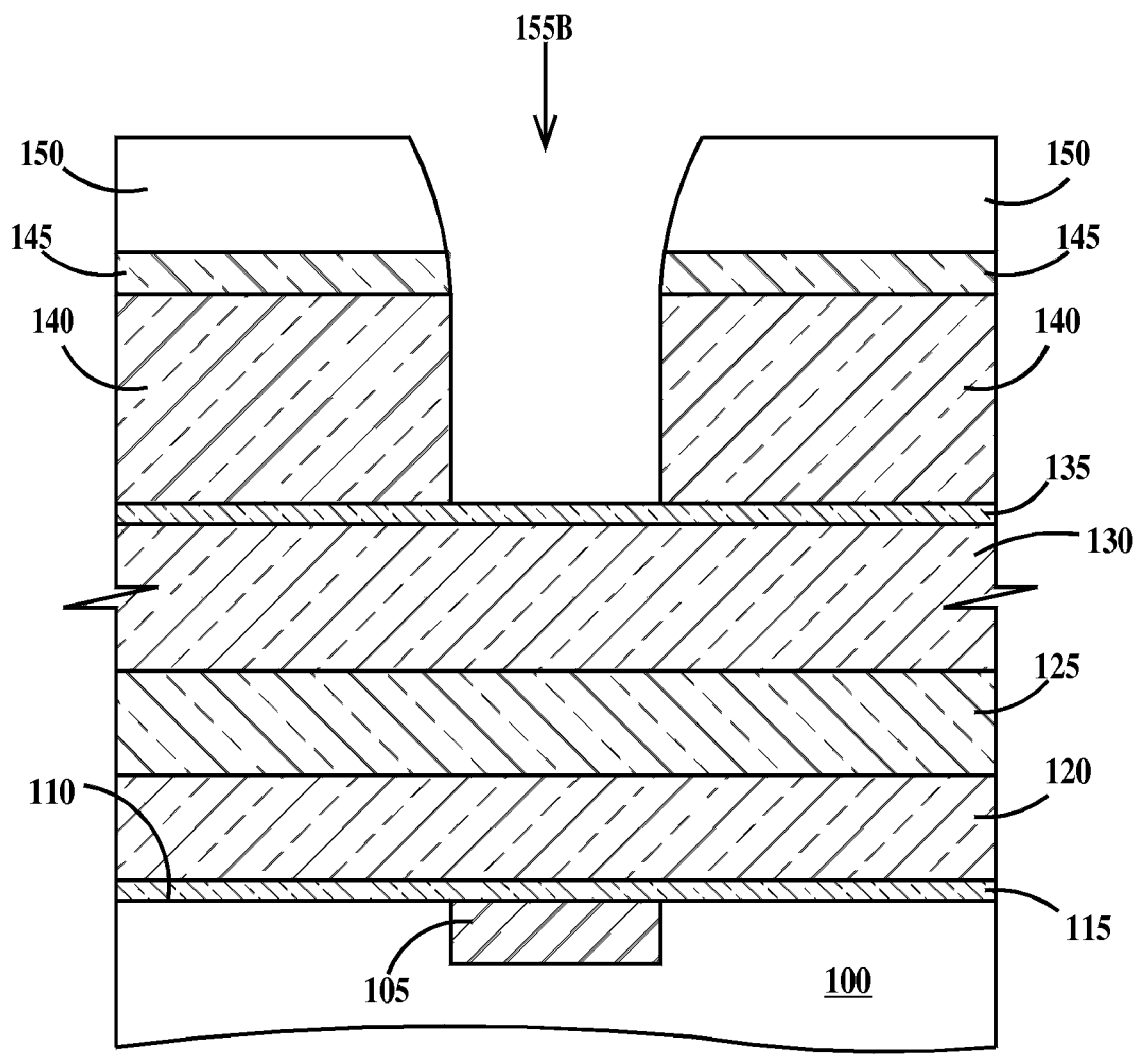

In FIG. 1D, the region of fourth dielectric layer 140 exposed in opening 155A of FIG. 1C is removed using an RIE that etches fourth dielectric layer 140 faster than profile modulation layer 135 (i.e., fourth dielectric layer 140 is RIE'd selective to profile modulation layer 135) to expose a region of the profile modulation layer in the bottom of an opening 155B. Note, photoresist layer 150 and ARC 145 are eroded by the fourth dielectric layer 140 RIE etch. The opening in the top surface of photoresist layer 150 is larger than the opening in the bottom surface of the photoresist layer. An example RIE process for etching fourth dielectric layer includes etching with a mixed $CO/C_4F_8/Ar$ gas derived plasma. This chemistry (at the proper bias, forward and reverse power, pressure and gas flows) etches silicon oxide about 25 times faster than silicon nitride.

Figure 1E:
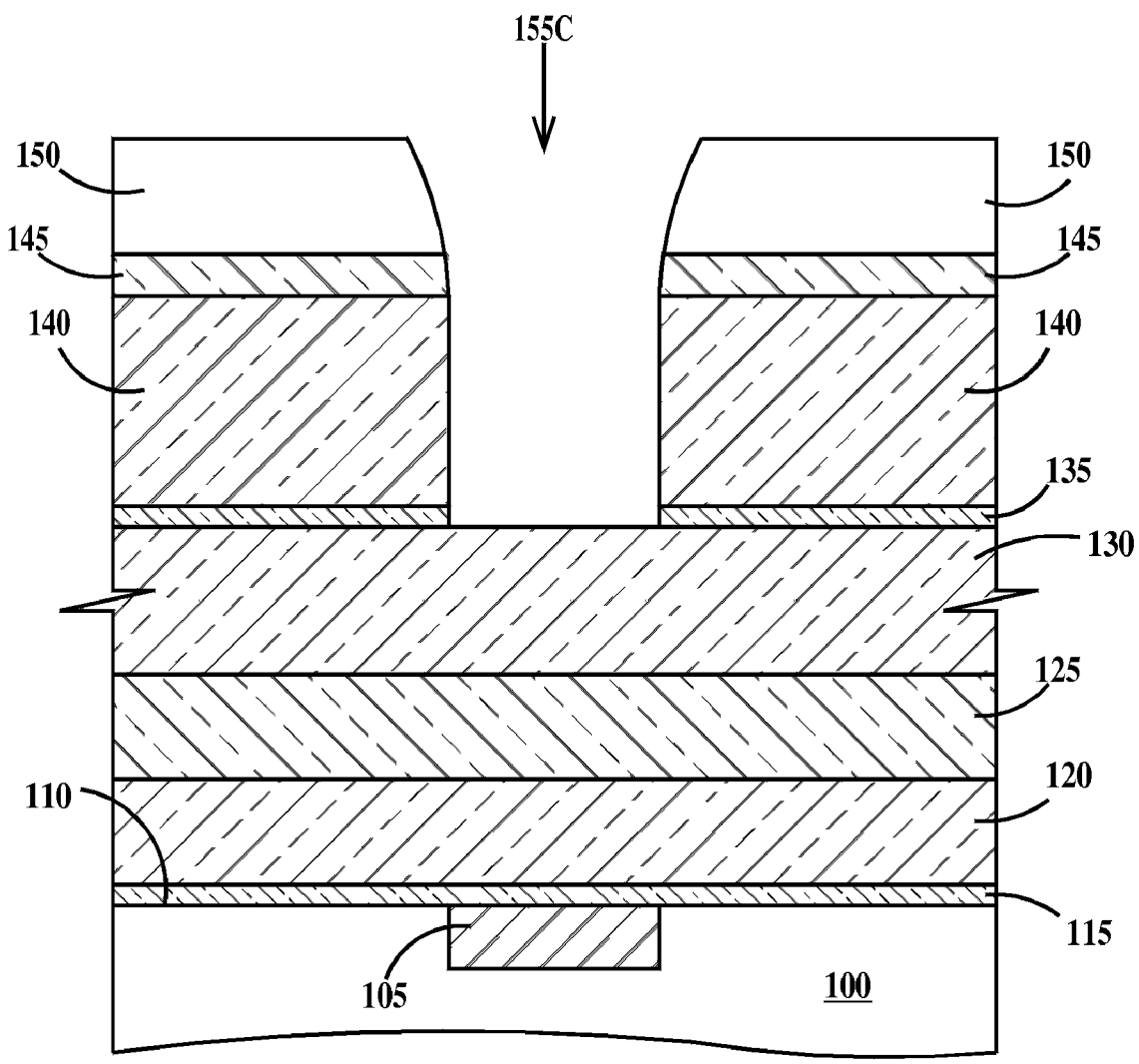

In FIG. 1E, the region of profile modulation layer 135 exposed in opening 155B of FIG. 1D is removed using an RIE that etches profile modulation layer 135 faster than third dielectric layer 130 (i.e., profile modulation layer 135 is RIE'd selective to third dielectric layer 130) to expose a region of the third dielectric layer in the bottom of an opening 155C. An example RIE process for etching profile modulation layer includes etching with a mixed $CHF_3/CF_4/Ar$ gas derived plasma. This chemistry (at the proper bias, forward and reverse power, pressure and gas flows) etches silicon nitride about 4 times faster than silicon oxide. It is advantageous to keep profile modulation layer 135 (and etch stop layer 115) as thin as possible.

Figure 1F:
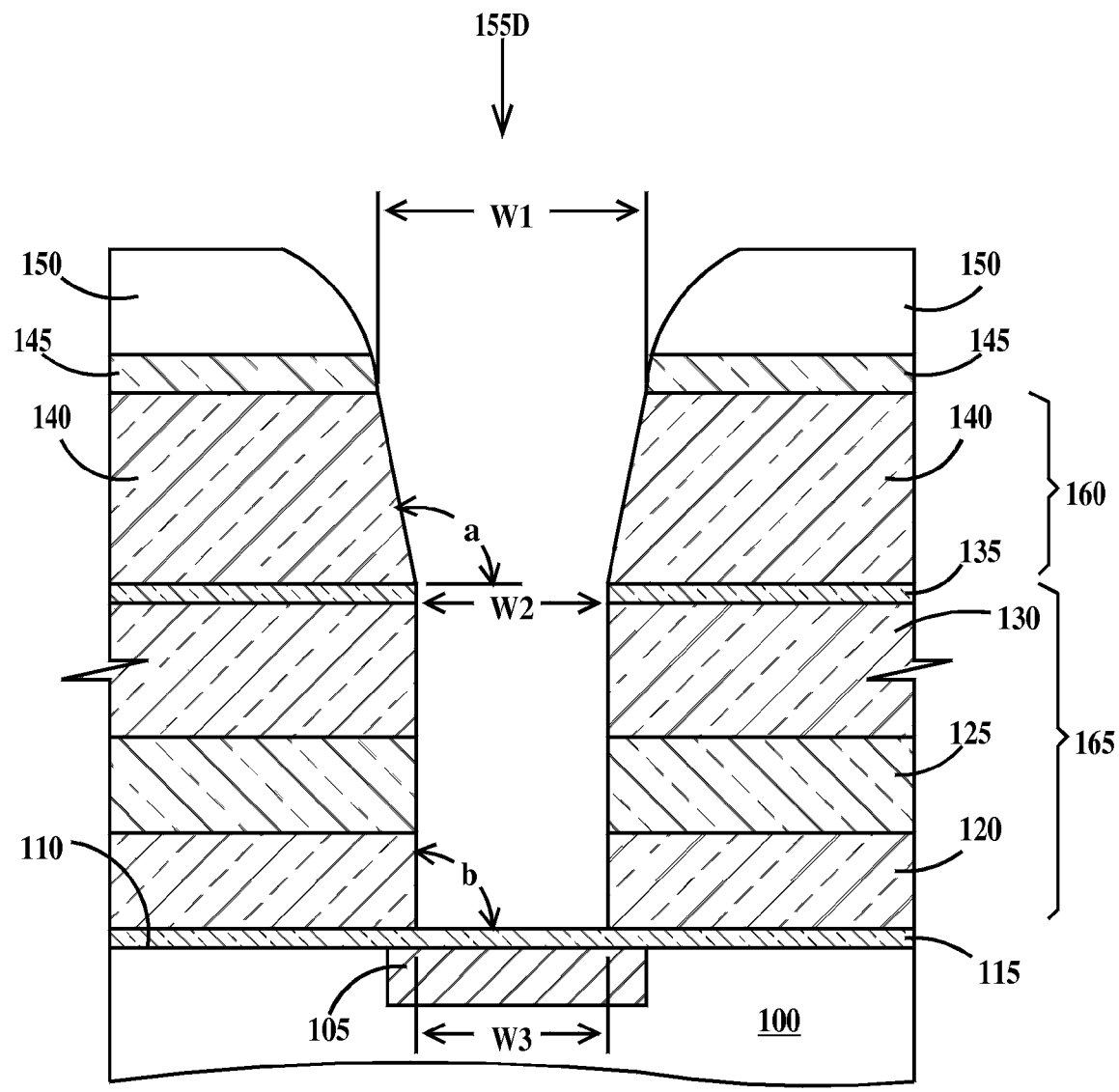

In FIG. 1F, the region of third dielectric layer 130 exposed in opening 155C of FIG. 1E is removed along with regions of second and first dielectric layers 125 and 120 aligned under opening 155C of FIG. 1E using an RIE that etches third, second and first dielectric layers 130, 125 and 120 faster than etch stop layer 115 and profile modulation layer 135 (i.e., third dielectric layer 130 is RIE'd selective to etch stop layer 115 and profile modulation layer 135) to expose a region of the etch stop layer in the bottom of an opening 155D. An example RIE process for etching third, second and first dielectric layers 130, 125 and 120 includes etching with a mixed $CO/C_4F_8/Ar$ gas derived plasma. Note, photoresist layer 150 and ARC 145 are further eroded by the third dielectric layer 130, second dielectric layer 125 and first dielectric 120 RIE etches. This etch is not selective to fourth dielectric layer 140 and in combination with the further erosion of photoresist layer 150 and ARC 145, a tapered upper region 160 of opening 155D is formed in the region of opening 155D formed through fourth dielectric layer 140. The sidewall of opening 155D in region 160 taper at an angle "a" measured between the sidewall and a plane parallel to top surface 110 of substrate 100. A lower region 165 of opening 155D is formed through profile modulation layer 135 and third, second and first dielectric layers 130, 125 and 120. The sidewall of opening 155D in region 165 is at an angle "b" measured between the sidewall and a plane parallel to top surface 110 of substrate 100. Opening 155D has width W1 measured at the top surface of fourth dielectric layer 140, a width W2 measured at a top surface of profile modulation layer 135 and a width W3, measured at a top surface of etch stop layer 115. W1 is greater than W2. In one example W1 is about 0.28 microns and W3 is about 0.16 microns.

In one example, W2 is equal to W3 and angle "b" is between about 87° and no greater than 90°. In one example W2 is greater than W3, however angle "b" is less than angle "a." Again, the presence of profile modulation layer 135 allows the widening of opening 155D at the top surface of fourth dielectric layer 140 in upper region 160 due to the controlled erosion of photoresist layer 150 while facilitating formation of a straight or sidewall in lower region 165. Without profile modulation layer 135, either opening 155D would be to narrow at the top to be filled with metal without incorporating large voids in the metal fill, or the value of W1 would need to be much greater to maintain the same value of W3 obtained with the presence of the profile modulation layer.

Figure 1G:
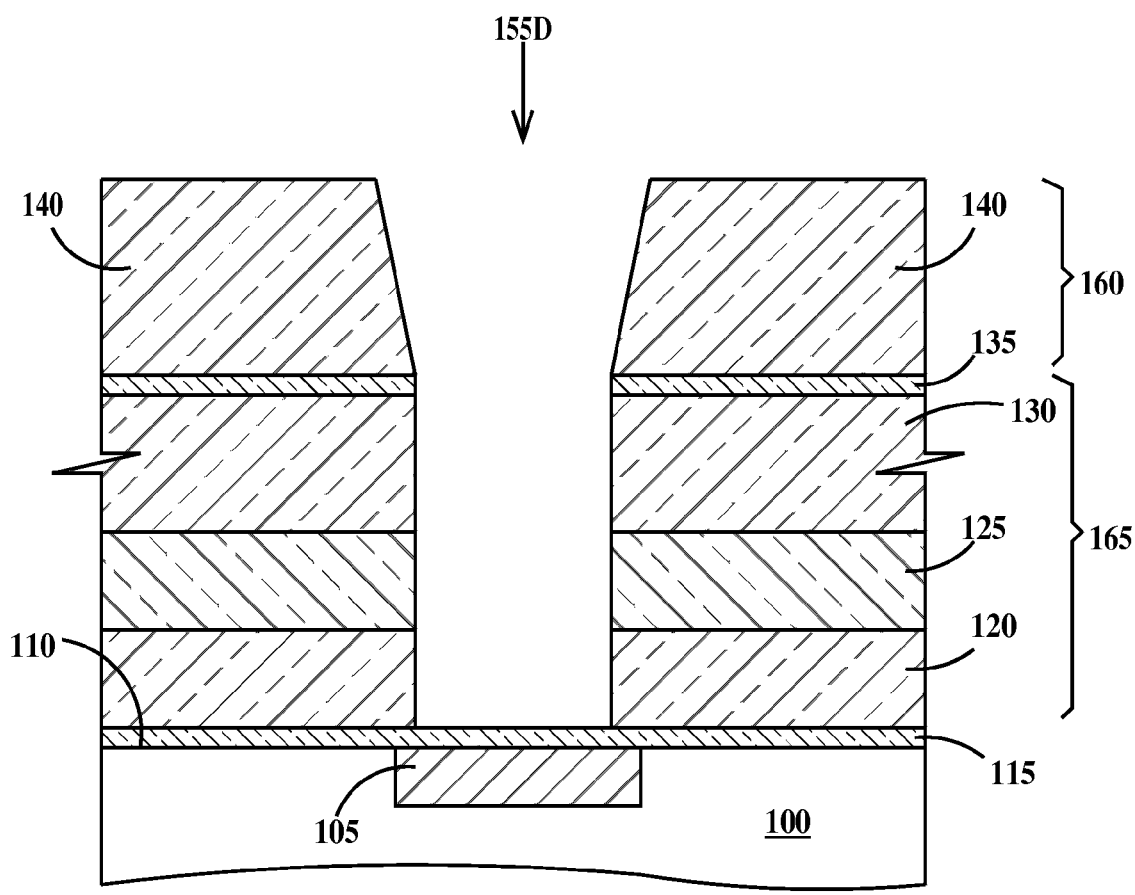

In FIG. 1G, photoresist layer 150 and arc 145 (See FIG. 1F) are removed using an oxygen ash process (i.e., $O_2$ plasma etch). Alternatively, this step may be performed after the process illustrated in FIG. 1H. It is advantageous to perform the photoresist removal step with etch stop layer 115 intact to prevent the photoresist removal process from oxidizing wire 105 particularly when wire 105 comprises copper.

Figure 1H:
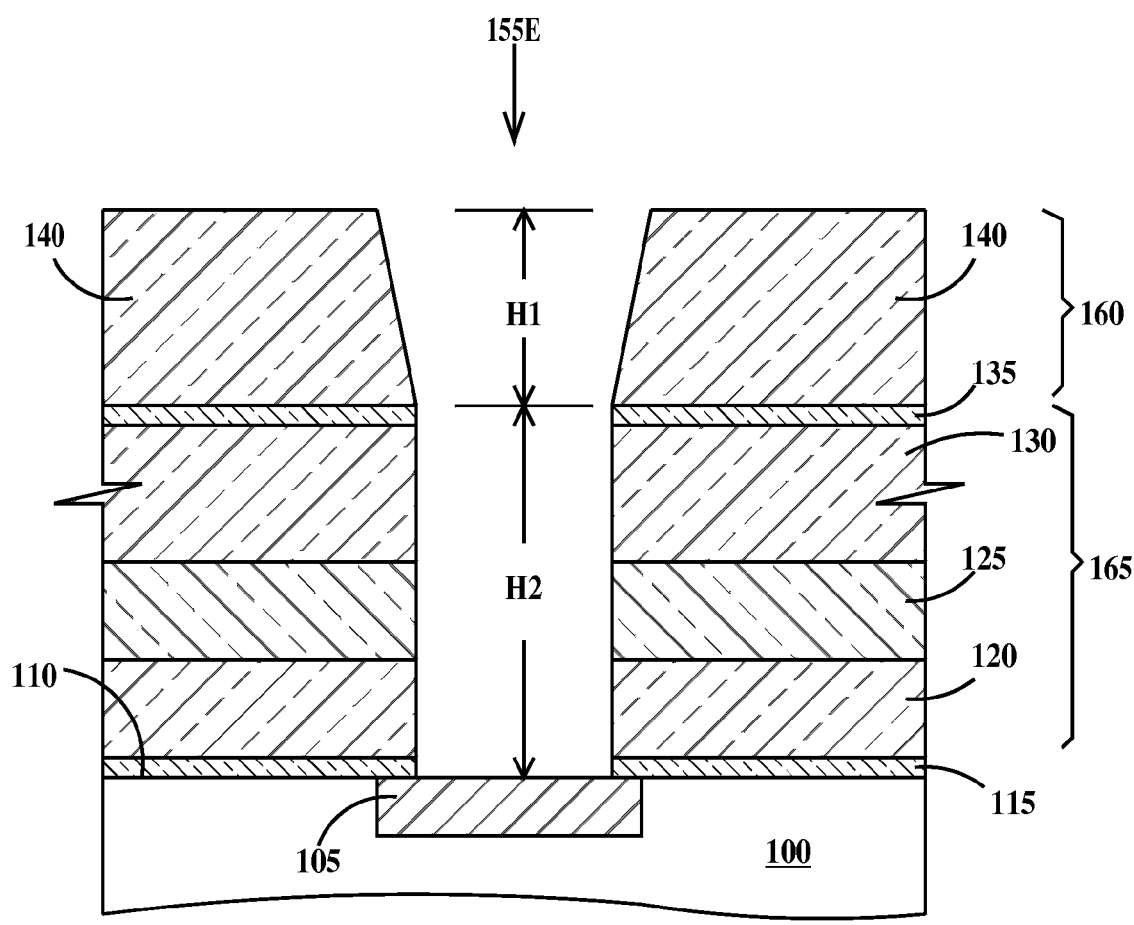

In FIG. 1H, the region of etch stop layer 115 exposed in opening 155D of FIG. 1G is removed using an RIE that etches stop layer 115 faster than first, second, third dielectric layers 120, 125 and 130 (i.e., etch stop layer 115 is RIE'd selective to first, second and third dielectric layers 120, 125 and 130, metal wire 105 and optionally fourth dielectric layer 140) to expose a region of metal wire 105 in the bottom of an opening 155E. An example RIE process for etching etch stop layer 115 includes etching with a mixed $CF_4/CHF_3/Ar/O_2$ gas derived plasma. Region 160 has a height H1 measured from the top surface of fourth dielectric layer 140 to the top surface of profile modulation layer 135 in a direction perpendicular to the top surface of wire 105 in substrate 100. Region 165 has a height H2 measured from the top surface of profile modulation layer 134 to the top surface of wire 105 in substrate 100 in a direction perpendicular to the top surface of wire 105 in substrate 100. In one example H1 is about 0.4 microns and H2 is between about 1 micron an and about 1.6 microns for total opening depth (i.e., H1+H2) of between about 1.4 microns and about 2.0 microns. With a value of W3 (see FIG. 1F) of about 0.16 microns the depth to width ratio of opening 155E is between about 1.4/0.16=about 8.75 and about 2.0/0.16=about 12.5. In one example, H1+H2 is equal to or greater than about 1 micron. In one example, H1+H2 is equal to or greater than about 2 microns. In one example (H1+H2)/W1 is greater than or equal to 5. In one example (H1+H2)/W1 is greater than or equal to 8.

Figure 1I:
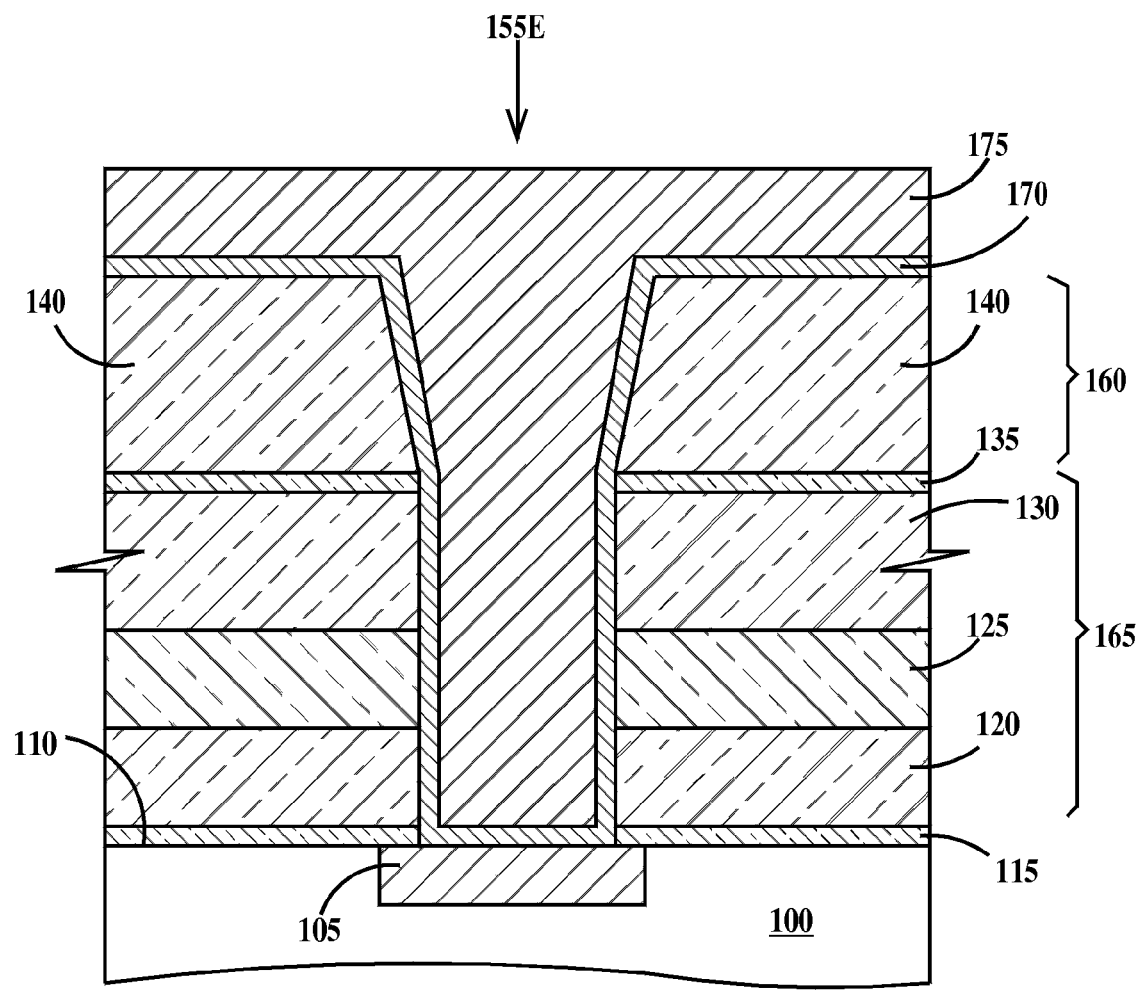

In FIG. 1I, an optional direct current (DC) clean (e.g., sputter cleaning with an inert gas) is performed followed by formation of an electrically conductive liner 170 on the sidewall of opening 155E and top surface of fourth dielectric layer 140 followed by overfilling the opening 155E with an electrically conductive core conductor 175. In one example, conductive liner 170 comprises, in the order of deposition, a layer of TaN, a layer of Ta and a layer of Cu and core conductor 175 comprises electroplated copper.

Figure 1J:
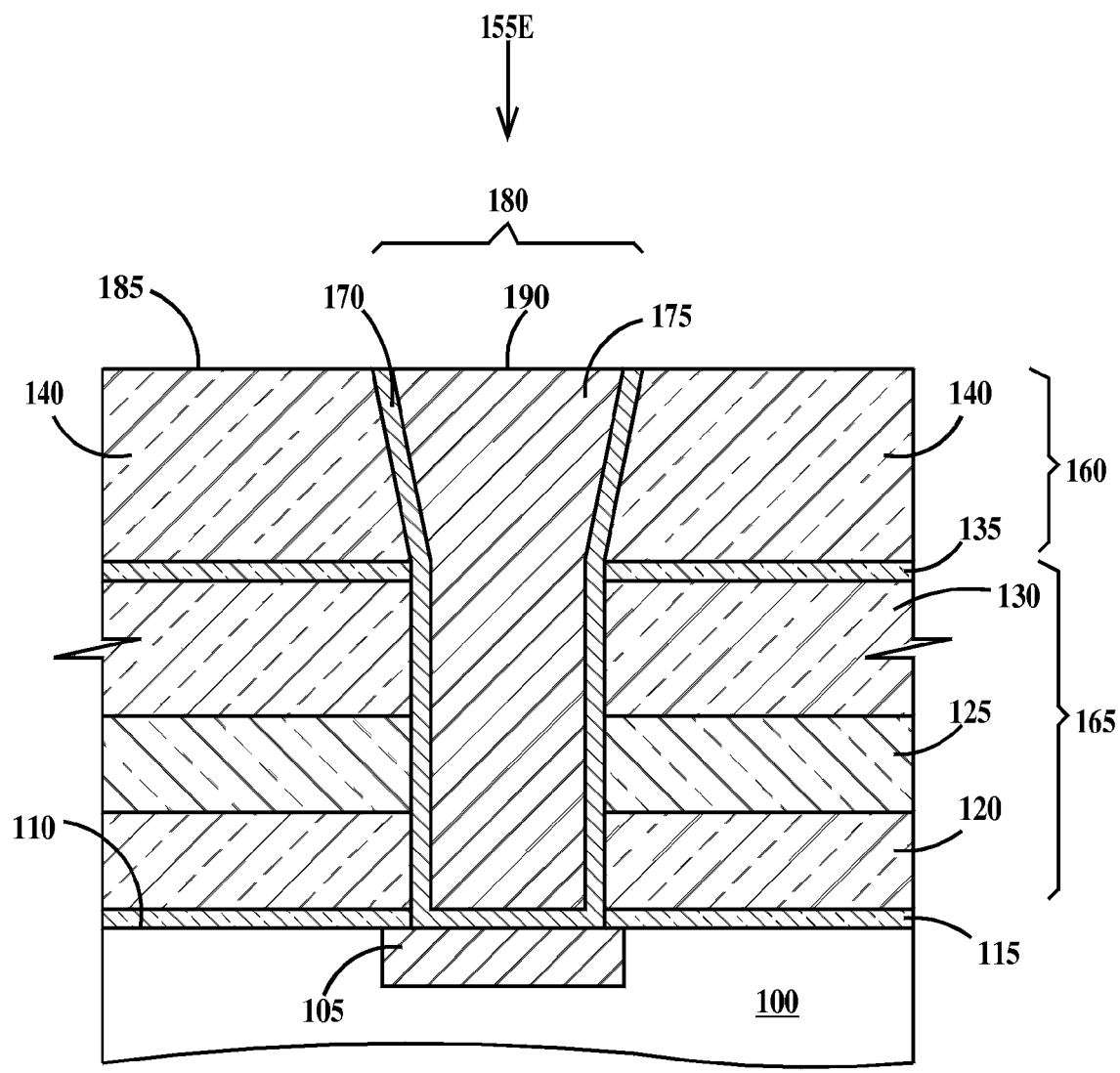

In FIG. 1J, a chemical-mechanical-polish (CMP) is performed to remove liner 170 and core conductor 175 from over fourth dielectric layer 140 to form an electrically conductive via 180 extending from a top surface 185 of the fourth dielectric layer to a top surface of wire 105 (making electrical contact with wire 105). After the CMP, a top surface 190 of via 180 is coplanar with top surface 185 of fourth dielectric layer 140.

It should be understood in the simplest form, embodiments of the present invention may be practiced on a dielectric stack where first, second and third dielectric layers 120, 125 and 130 of FIG. 1 are replaced with a single dielectric layer. In other embodiments, their may be more than three dielectric layers in the stack represented by first, second and third dielectric layers 120, 125 and 130 of FIG. 1, through they should all be similar materials (e.g., silicon oxides) or have similar selectivity's to the RIE used to etch stop and profile modulation layers.

Figure 2A:
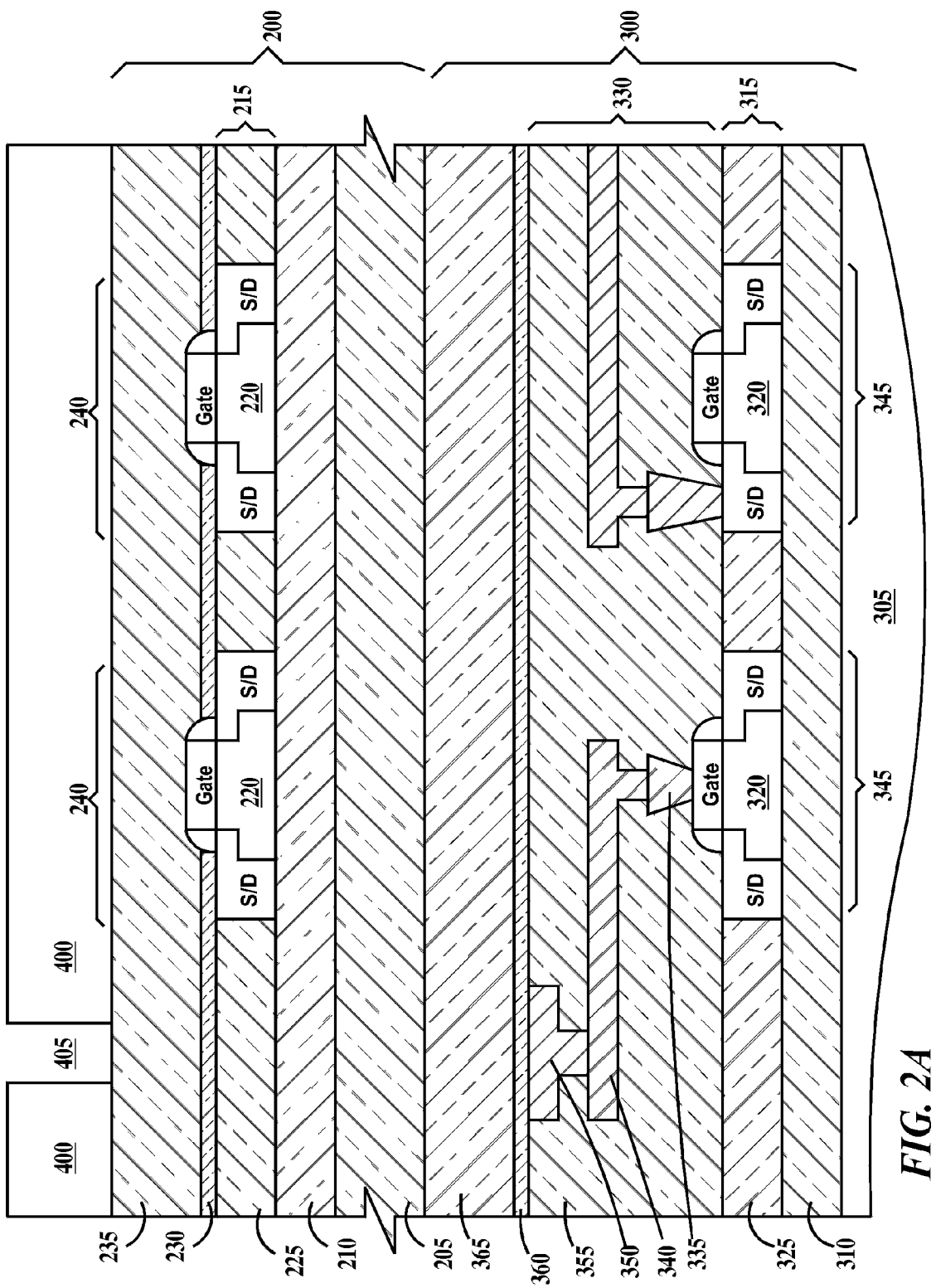
FIGS. 2A through 2C are cross-sections of the fabrication of a first exemplary three dimensional integrated circuit according to embodiments of the present invention.
Figure 2B:
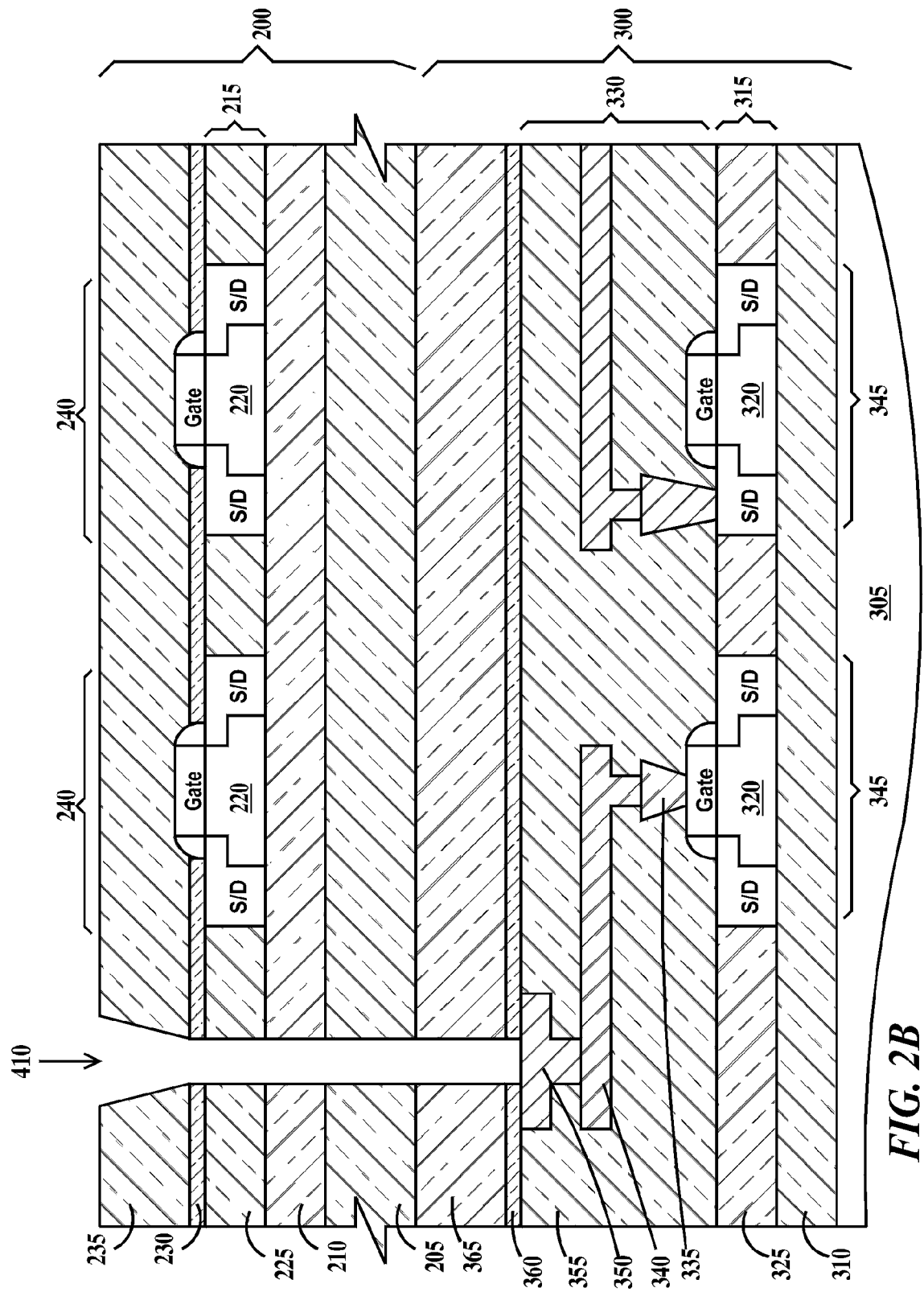
Figure 2C:
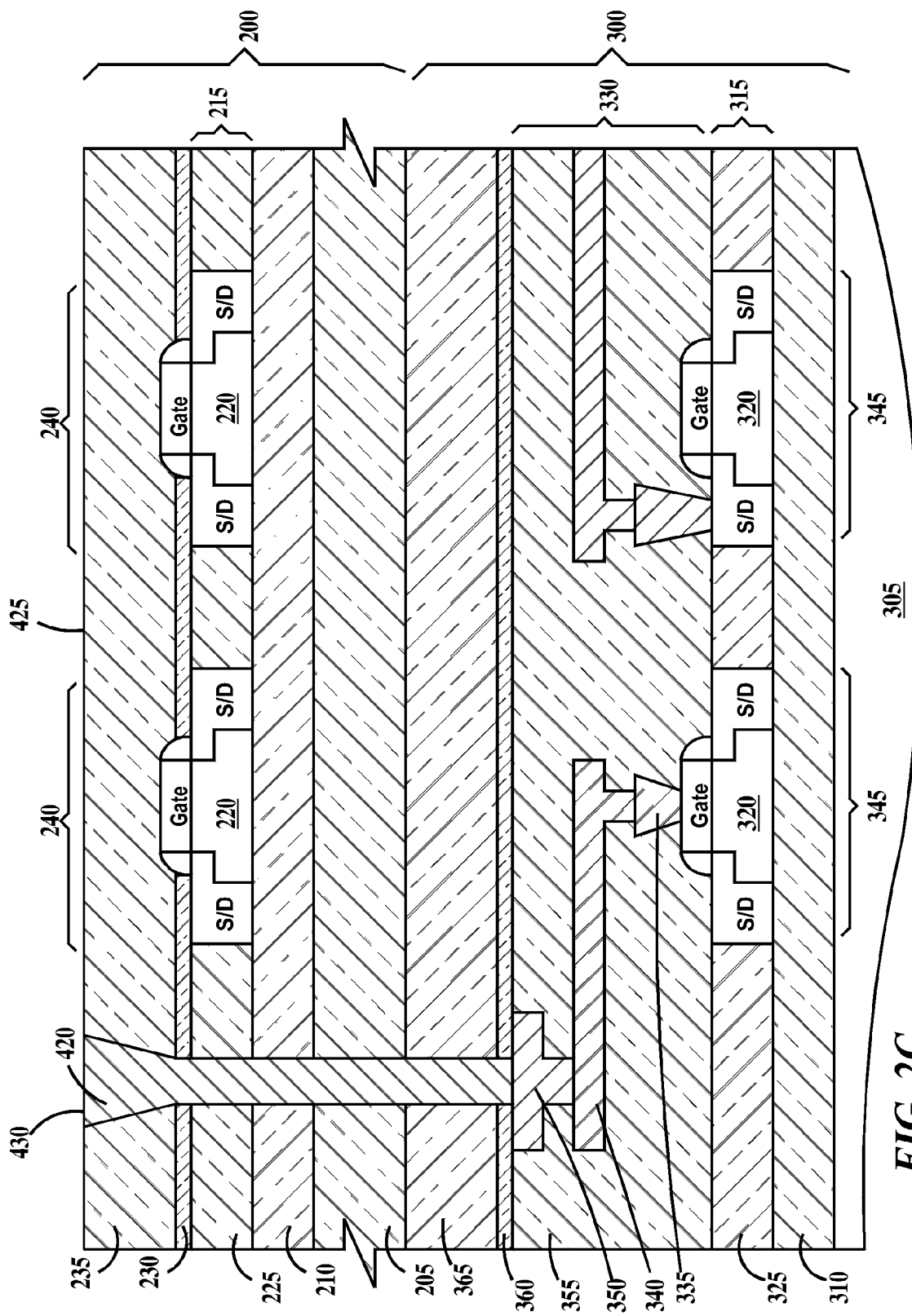

FIGS. 2A through 2C are cross-sections of the fabrication of a first exemplary three-dimensional integrated circuit according to embodiments of the present invention. In FIG. 2A, an upper semiconductor substrate 200 includes a silicon oxide bonding layer 205, a BOX layer 210 on the bonding layer, a semiconductor layer 215 including semiconductor regions 220 and STI 225 formed in the semiconductor layer, a profile modulation layer 230 on top of semiconductor layer 215 and a dielectric layer 235 on the passivation layer. Exemplary, field effect transistors (FETs) 240 comprising source/drains (S/D) formed in semiconductor regions 220 and gates formed over the silicon regions between the S/Ds are formed in substrate 200. Semiconductor layer 215 may comprise, for example, Si, SiGe, Ge, GaAs or InP.

Etch stop layer may also serve as a diffusion barrier layer for copper and/or as a passivation layer.

A substrate 300 includes a semiconductor base later 305, a BOX layer 310 on the base silicon layer, a semiconductor layer 315 including semiconductor regions 320 and STI 325 formed in the silicon layer, an interlevel dielectric (ILD) wiring set 330 including contacts 335 and wires 340 and 350 formed in respective dielectric layers of dielectric layers 355 of ILD wiring set 330. Semiconductor base layer 305 may comprise, for example, Si, SiGe, Ge, GaAs or InP. Semiconductor layer 315 may comprise, for example, Si, SiGe, Ge, GaAs or InP.

An ILD wiring level comprises a dielectric layer and one or more wires, vias or contacts embedded therein. ILD wiring set 330 is illustrated having three ILD wiring levels. ILD wiring set 330 may include more or less ILD levels (down to one level containing contacts 335) or as many levels as required by the integrated circuit design. The ILD wiring levels of ILD wiring set 330 are, by way of example, damascene and dual-damascene ILD levels formed by damascene and dual-damascene processes.

A damascene process is one in which wire trenches or via openings are formed in a dielectric layer, an electrical conductor of sufficient thickness to fill the trenches is deposited on a top surface of the dielectric, and a chemical-mechanical-polish (CMP) process is performed to remove excess conductor and make the surface of the conductor co-planar with the surface of the dielectric layer to form damascene wires (or damascene vias). When only a trench and a wire (or a via opening and a via) is formed the process is called single-damascene.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planar with the surface the dielectric layer to form dual-damascene wires and dual-damascene wires having integral dual-damascene vias.

Returning to FIG. 2A, exemplary, field effect transistors (FETs) 345 comprising source/drains (S/D) formed in semiconductor regions 320 and gates formed over the silicon regions between the S/Ds are formed in substrate 300. Contacts 335 and wires 340 electrically connect FETs 345 into circuits or portions of circuits. Substrate 300 further includes an etch stop layer 360 on top of ILD wiring set 355 and a silicon oxide bonding layer 365 on the etch stop layer. Bonding layers 205 and 365 bond substrates 200 and 300 into a single structure. The bonding process includes placing the bonding layers 205 and 365 in contact at a temperature above room temperature but below, for example, 350° C.

In one example, dielectric layers 235, 355 and STI 225 are independently selected from the group consisting of thermal oxide, HDP oxide, PECVD oxide, UDP oxide, TEOS oxide and spin-on-oxide, and bonding layers 205 and 365 are LTO. In one example profile modulation layer 230 and etch stop layer 360 are independently selected from the group consisting of silicon nitride, silicon carbide, silicon oxy nitride or silicon oxy carbide. In a second example, dielectric layers 235, 355 and STI 225 and bonding layers 205 and 365 are advantageously first similar materials (e.g., silicon oxides) and etch stop layer 360 and profile modulation layer 230 are advantageously second similar materials (e.g. silicon nitrides), where the first and second materials may be selectively plasma etched relative to each other. In one example, dielectric layer 235 is between about 2500 Å and about 7500 Å thick. In one example, profile modulation layer 230 is between about 250 Å and about 1000 Å thick. In one example, STI 225 is between about 1500 Å and about 2500 Å thick. In one example, BOX layer 210 is between about 1500 Å and about 2500 Å thick. In one example, bonding layer 210 is between about 2500 Å and about 3500 Å thick. In one example, bonding layer 365 is between about 2500 Å and about 3500 Å thick. In one example, etch stop layer 360 is between about 250 Å and about 1000 Å thick.

Substrate 200 may be formed from an SOI substrate by removal of the semiconductor (e.g., silicon) base layer under BOX layer 210 after formation of FETs 240 followed by a deposition of a layer of LTO to form bonding layer 205 on BOX layer 225. Substrate 300 may be formed from an SOI substrate complete with ILD wiring set 330 followed by deposition of etch stop layer 360 and a deposition of a layer of LTO to form bonding layer 365.

In FIG. 2A, a photoresist layer 400 is formed on dielectric layer and patterned to form an opening 405 in the photoresist layer in a manner similar to that described supra for opening 155 in photoresist 150 of FIG. 1B. While no ARC (TARC or BARC) is illustrated in FIG. 2A, an ARC (TARC and/or BARC) may be used.

In FIG. 2B, an opening 410 is formed through dielectric layer 235, profile modulation layer 230, STI layer 225, BOX layer 210, bonding layers 205 and 365 and etch stop layer 360 to expose a top surface of wire 350. Then photoresist layer 400 (see FIG. 2A) is removed. The methodology is similar to that described supra with respect to the formation of opening 155E of FIG. 1H. First dielectric layer 235 is RIE'd selective to profile modulation layer 230 using for example, a mixed $CO/C_4F_8/Ar$ gas derived plasma when dielectric layer 235 is silicon oxide and profile modulation layer 230 is silicon nitride. This chemistry (at the proper bias, forward and reverse power, pressure and gas flows) etches silicon oxide about 25 times faster than silicon nitride. Second, profile modulation layer 230 is RIE'd selective to dielectric layer 235 and STI 225, using, for example; a mixed $CHF_3/CF_4/Ar$ gas derived plasma when dielectric layers 235 and STI 225 are silicon dioxide and profile modulation layer is silicon nitride. This chemistry (at the proper bias, forward and reverse power, pressure and gas flows) etches silicon nitride about 4 times faster than silicon oxide. It is advantageous to keep profile modulation layer 230 (and etch stop layer 360) as thin as possible. Third, STI 235, BOX layer 210, bonding layers 205 and 365 are RIE'd selective profile modulation layer 230 and etch stop layer 360 using, for example, a mixed $CO/C_4F_8/Ar$ gas derived plasma when STI 235, BOX layer 210, bonding layers 205 and 365 are silicon oxide and profile passivation layer 230 and etch stop layer 360 are silicon nitride. The third RIE process is not selective to dielectric layer 235 so opening 410 has a tapered profile in dielectric layer 235, a substantially straight or slightly tapered profile in STI 225, BOX 210, and bonding layers 205 and 365 (compared to the taper of opening 410 in dielectric layer 235) because of the presence of profile modulation layer 230. Fourth, photoresist layer 400 (see FIG. 2A) is removed using an oxygen ash process. Fifth, etch stop layer 360 is RIE'd selective to dielectric layer 235. STI 225, BOX layer 210 and bonding layers 205 and 365 using, for example, a mixed $CF_4/CHF_3/Ar/O_2$ gas derived plasma when etch stop layer 360 and profile modulation layer 230 are silicon nitride and dielectric layer 210, STI 225, BOX layer 225 and bonding layers 205 and 365 are silicon oxide. Sixth an optional DC clean using $N_2$ and $H_2$ (i.e. a mixed $N_2/H_2$ gas derived plasma etch) is performed.

In FIG. 2C, opening 410 (see FIG. 2B) is filled with an electrical conductor for an electrically conductive via 420 in electrical contact with wire 350. In one example, via 420 is formed by deposition of an electrically conductive liner on the sidewall of opening 410 (see FIG. 2B) and top surface of dielectric layer 235 followed by overfilling the opening with an electrically conductive core conductor. In one example, the conductive liner comprises, in the order of deposition, a layer of TaN, a layer of Ta and a layer of Cu and the core conductor comprises electroplated copper. After filling the opening a CMP is performed to remove the liner and core conductor from over dielectric layer 235 to form the via 420 extending from a top surface 425 of dielectric layer 235 to a top surface of wire 350. After the CMP, a top surface 430 of via 420 is coplanar with top surface 425 of dielectric layer 235. Thus via 420 is a damascene via.

Electrically conductive contacts (not shown) may be made through dielectric layer 235 to the S/Ds and gates of FETs 240. Alternatively, the contacts may be formed prior to formation of photoresist layer 400 (see FIG. 2A). Additional interlevel dielectric layer containing wires may be formed on top of dielectric layer 235, the wires therein electrically connecting via 420 to FETs 240 and FETs 345 into circuits. See FIG. 34.

Figure 3:
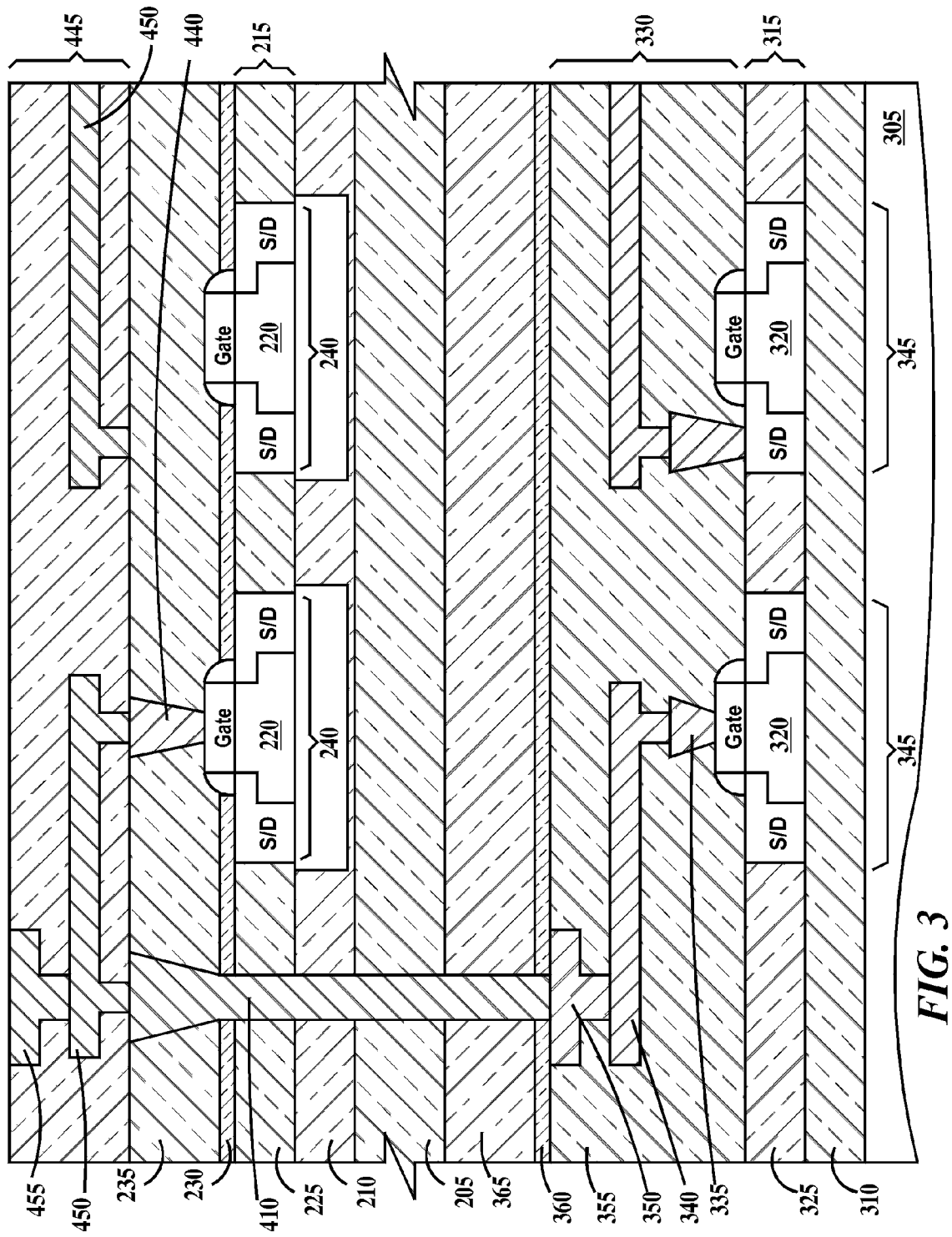
FIG. 3 is a cross-section of additional fabrication steps in the fabrication of three-dimensional integrated circuit according to embodiments of the present.

FIG. 3 is a cross-section of additional fabrication steps in the fabrication of three-dimensional integrated circuit according to embodiments of the present. In FIG. 3, an electrically conductive contact 440 is formed to one of FETs 240 and an ILD wiring set 445 is formed on dielectric layer 235. ILD wiring level set 445 includes wires 450 and a terminal pad 455. ILD wiring set 445 is illustrated having two ILD wiring levels. ILD wiring level set 445 may include more or less ILD levels (down to one level containing wires/terminal pads 455) or as many levels as required by the integrated circuit design. The ILD wiring levels of ILD wiring set 445 are, by way of example, damascene and dual-damascene ILD levels formed by damascene and dual-damascene processes. Contact 440 is illustrated as a damascene contact. One wire 450 connects contact 440 to contact 420. Thus a three-dimensional integrated circuit is formed comprising FETs 240 and FETs 345. It should be understood that ILD wiring level set may be formed over dielectric layer 235 of FIG. 2C to generate a structure similar to that illustrated in FIG. 3, but where the upper substrate is a bulk silicon substrate instead of an SOI substrate.

In both the examples of FIGS. 2A through 2C and 3, silicon layer 215 and BOX 210 is an SOI substrate and silicon layer 315 and BOX is an SOI substrate. It should be understood that substrate 300 may be replaced with a bulk silicon substrate.

Thus the embodiments provide a process methodology for deep vias and semiconductor devices using deep via structures that have profiles that are less susceptible to metal fill problems.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   (a) forming an etch stop layer on a top surface of a substrate;
   (b) forming a first dielectric layer on a top surface of said etch stop layer;
   (c) forming a profile modulation layer on a top surface of said first dielectric layer;
   (d) forming a second dielectric layer on a top surface of said profile modulation layer;
   (e) forming a photo-imaging layer on a top surface of said second dielectric layer;
   (f) forming an opening in said photo-imaging layer, a region of said top surface of said second dielectric layer exposed in a bottom of said opening;
   after (a) through (f), (g) performing a first reactive ion etching of said second dielectric layer using a first etch chemistry selective to said profile modulation layer to form an opening through said second dielectric layer;
   after (g), (h) performing a second reactive ion etching of said profile modulation layer using a second etch chemistry selective to said first and second dielectric layers to extend said opening through said profile modulation layer;

after (h), (i) performing a third reactive ion etching of said first dielectric layer using a third etch chemistry selective to said profile modulation layer and selective to said etch stop layer to extend said opening through said first dielectric layer;

after (i), (j) performing a fourth reactive ion etching of said etch stop layer using a fourth etch chemistry selective to said first and second dielectric layers to extend said opening through said etch stop layer; and after (j), (k) removing said photo-imaging layer, after said removing said photo-imaging layer, said opening extending from said top surface of said second dielectric layer, through said second dielectric layer, through said profile modulation layer, through said first dielectric layer and through said etch stop layer to said top surface of said substrate.

2. The method of claim 1, wherein said third etch chemistry is not selective to said second dielectric layer.

3. The method of claim 1, wherein said first and third etch chemistries are a same chemistry.

4. The method of claim 1, wherein said second and fourth etch chemistries are a same chemistry.

5. The method of claim 1, wherein removing said photo-imaging layer is performed between reactive ion etching said first dielectric layer and reactive ion etching said etch stop layer.

6. The method of claim 1, wherein said first dielectric layer and second dielectric layer comprise silicon oxide and said profile modulation layer and said etch stop layer comprise silicon nitride.

7. The method of claim 1, wherein:
a first width of said opening measured in first direction parallel to said top surface of said second dielectric layer at said top surface of said second dielectric layer is greater than a second width of said opening measured in said first direction at said top surface of said profile modulation layer and greater than a third width of said opening measured in said first direction at said top surface of said substrate, said second width greater than or equal to said third width; and
wherein a ratio of a depth of said opening measured in a second direction perpendicular to said first direction from said top surface of said second dielectric layer to said top surface of said substrate to said first width is equal to or greater than five.

8. The method of claim 1, further including:
after said removing said photo-imaging layer, filling said opening with said electrical conductor.

9. The method of claim 8, wherein said filling said opening with an electrical conductor comprises:

depositing a tantalum nitride layer over sidewalls and a bottom of said opening;
depositing a tantalum layer on said tantalum nitride layer;
depositing a seed copper layer on said tantalum layer;
electroplating an electroplated copper layer on said seed copper layer, said electroplated copper layer completely filling remaining spaces in said opening; and
performing a chemical-mechanical-polish to remove said tantalum nitride layer, said tantalum layer, said seed copper layer and said electroplated copper layer from over said top surface of said second dielectric layer.

10. The method of claim 1, wherein said photo-imaging layer includes a photoresist layer over an antireflective coating on said top surface of said first dielectric layer and forming said opening in said photo-imaging layer comprises exposing said photoresist layer to actinic radiation through a patterned photomask, developing said exposed photoresist layer and performing a fifth reactive ion etching of said antireflective coating using with fifth etch chemistry where said anti-reflective coating is not protected by said photoresist layer.

11. The method of claim 10, wherein said fifth etch chemistry is selective to said photoresist layer and said first dielectric layer and wherein said fifth, second and fourth etch chemistries are a same chemistry.

12. The method of claim 8, wherein said photo-imaging layer is removed using an oxygen plasma.

13. The method of claim 9, further including performing a DC sputter clean before depositing said tantalum nitride layer.

14. The method of claim 1, wherein said first dielectric layer consists of a stack of a third dielectric layer on a fourth dielectric layer on a fifth dielectric layer, said third dielectric layer on said etch stop layer, said profile modulation layer on said fifth dielectric layer.

15. The method of claim 14, wherein said third and fourth dielectric layers are low temperature oxide (LTO) and said fifth dielectric layer is high density plasma (HDP) oxide.

16. The method of claim 1, wherein said opening extending said opening extending from said top surface of said second dielectric layer, through said second dielectric layer, through said profile modulation layer, through said first dielectric layer and through said etch stop layer to said top surface of said substrate is wider at a top surface of said second dielectric layer than at said profile modulation layer and has a about a same width from said profile modulation layer to said substrate.

* * * * *